US 9,778,286 B2

(12) United States Patent
Gouzman et al.

(10) Patent No.: US 9,778,286 B2
(45) Date of Patent: Oct. 3, 2017

(54) SENSORS FOR POWER DISTRIBUTION NETWORK AND ELECTRICAL GRID MONITORING SYSTEM ASSOCIATED THEREWITH

(71) Applicant: The Research Foundation for the State University of New York, Albany, NY (US)

(72) Inventors: Mikhail Gouzman, Centereach, NY (US); Serge Luryi, Setauket, NY (US); Satya Sharma, Setauket, NY (US); Peter Shkolnikov, Setauket, NY (US)

(73) Assignee: The Research Foundation For The State University of New York, Albany, NY (US)

( * ) Notice: Subject to any disclaimer, the term of this patent is extended or adjusted under 35 U.S.C. 154(b) by 593 days.

(21) Appl. No.: 14/283,476

(22) Filed: May 21, 2014

(65) Prior Publication Data
US 2014/0350739 A1 Nov. 27, 2014

Related U.S. Application Data

(60) Provisional application No. 61/825,592, filed on May 21, 2013.

(51) Int. Cl.
*G01R 15/14* (2006.01)
*G05F 1/70* (2006.01)

(52) U.S. Cl.
CPC ............. *G01R 15/14* (2013.01); *G05F 1/70* (2013.01)

(58) Field of Classification Search
CPC ......... G05F 1/70; H02J 3/00; H02J 2003/007; G01R 19/2513; G01R 21/133;
(Continued)

(56) References Cited

U.S. PATENT DOCUMENTS 6,005,384 A * 12/1999 Hemminger ........... G01R 22/00
324/142
6,714,000 B2 * 3/2004 Staats ................ G01R 21/1331
324/107

(Continued)

OTHER PUBLICATIONS

C.J. Bandim, J.E.R. Alves, A.V. Pinto, F.C. Souza, M.R.B. Loureiro, C.A. Magalhaes, and D.F. Galvez, "Identification of energy theft and tampered meters using a central observer meter: a mathematical approach," Proc. IEEE PES Transmission and Distribution Conference and Exposition, Rio de Janeiro, Brazil, Sep. 2003, pp. 163-168.*

*Primary Examiner* — Sean Shechtman
*Assistant Examiner* — Shon Foley
(74) *Attorney, Agent, or Firm* — Lawrence G. Fridman, Esq.; Feigin & Fridman, LLC

(57) ABSTRACT

A network of sensors is associated with a power distribution network. Sensors are positioned at each connecting line in the vicinity of each node of the power distribution network. The sensors regularly report the following measured data to the central processing unit: a geographical position of each sensor, direction of the energy flow relative to the nearest node; and value of RMS current synchronously measured over the entire network and averaged over chosen averaging period. The central processing unit includes an arrangement for receiving the measured data and using this data for constructing and updating a graph and a state of the power distribution network.

20 Claims, 3 Drawing Sheets

(58) Field of Classification Search
CPC .... G01R 15/181; G01R 31/086; G01R 25/00; G01R 22/10; G01R 21/06; G01R 19/175; Y02E 60/728; Y02E 40/74; Y04S 10/265; Y04S 10/30; Y04S 20/32; Y04S 20/48; G06Q 50/06
USPC ........................................................ 700/291
See application file for complete search history.

(56) References Cited

U.S. PATENT DOCUMENTS

| | | | |
|---|---|---|---|
| 8,981,895 B2* | 3/2015 | Bush | H04L 63/1416 340/3.1 |
| 2004/0169590 A1* | 9/2004 | Haughawout | G08C 17/00 340/12.29 |
| 2007/0182362 A1* | 8/2007 | Trainor | H01M 10/46 320/101 |
| 2008/0077336 A1* | 3/2008 | Fernandes | G01R 15/142 702/57 |
| 2008/0147335 A1* | 6/2008 | Adest | G01D 4/004 702/64 |
| 2012/0029715 A1* | 2/2012 | Curt | G01D 4/004 700/291 |
| 2012/0079219 A1* | 3/2012 | Di Zenzo | G06F 1/3225 711/156 |
| 2014/0164377 A1* | 6/2014 | Kanabar | H04Q 9/00 707/737 |

* cited by examiner

SENSORS FOR POWER DISTRIBUTION NETWORK AND ELECTRICAL GRID MONITORING SYSTEM ASSOCIATED THEREWITH

REFERENCE TO RELATED APPLICATION

This Application claims priority of U.S. Provisional Application Ser. No. 61/825,592 filed by the inventors on May 21, 2013, the entire disclosure of which is hereby incorporated by reference.

FIELD OF THE INVENTION

The present invention relates to characterization and monitoring of the state of a power distribution network.

BACKGROUND OF THE INVENTION

One of the significant shortcomings of the contemporary power grid distribution systems, is that the systems do not know their own state. This is painfully felt during periods of massive failure caused by the fury of the elements or by a technical failure of a major component. Making power distribution networks robust and rapidly recoverable after natural disasters is perhaps the most urgent task in the on-going improvement of the national infrastructure. The importance of this task is generally understood. Its key elements include implementing modern monitor and control systems for power networks. These two systems must work coherently (with due regard for each other) with the monitor system setting the appropriate environment for the control system.

What is there to monitor, is an essential question. Each power distribution network can be described by a Graph represented by nodes of specified nature, their specified geographical position on a 2D map, and the topology of connecting lines. The state of the network is further characterized by the energy flow over the Graph.

Disruptions of the energy flow are associated with the breakdown of electrical connectivity of the power network and the required information that fully characterizes the network is therefore topological in nature. This is not, however, the shape in which the information about network failures reaches the control room of the contemporary utility. Instead of the desired automatic description of energy-flow disruptions, one deals with haphazard telephone reports of "no light in our house". The price we pay is in delayed and low-efficiency repair activity.

Alternative approaches to automatic monitoring state of the power grid are as follows. A simple system could be based on "on-off" reports of local access to power, an automated sensor-based version of the customer telephone call. Even when such reports are fully collected and accurate, they provide no information needed for a topological analysis of the possibly impaired connectivity of the grid.

On the other hand, sophisticated systems may be based on phasor measurement units (PMU). The PMU are sometimes called the synchrophasors, as they measure the instantaneous values of both the voltage and the current synchronously over the network. A PMU network can be compared to a multi-channel digital oscilloscope with synchronized channels in different locations. This is an expensive proposition and to-date PMU installation has been limited to critical substations of a power grid. The use of PMU data presumes the preliminary knowledge of the network topology, which is justified only if the network is restricted to the backbone of principal intersecting locations.

The electrical grid monitor system (EGMS) discussed in the application is based on the modern sensor, communication and computational technologies. The EGMS will not tamper with the power networks themselves and it can be applied both to the existing grids and the future smart grids. The sensors to be used must be inexpensive and safe. The latter requirement precludes direct electrical contact with "hot" wires, so that the smart measurements should be based on sensing the magnetic field.

The approach of the invention to the EGMS aims at collecting the minimum data necessary to reconstruct the topological organization of the network. This makes the system inexpensive both in hardware and installation. The essential aspects of the invention that lead to this cost reduction are (i) abandoning instantaneous flow of data in favor of the average and (ii) eliminating all galvanic measurements, i.e. direct contact of sensors with the "hot" wire. Therefore, the EGMS can be contemplated to assume an utmost penetration of the power grid, down to single household units. The cost of individual sensors associated with the invention is substantially reduced. Such sensors can be installed and maintained by the relatively low level electric utility personnel, causing further cost reduction of installation and maintenance of the electrical grid monitor system of the invention.

SUMMARY OF THE INVENTION

An essential aspect of the invention provides the electrical grid monitor system (EGMS) based on modern sensor, communication and computational technologies. The system does not require restructuring of the contemporary power distribution networks and can be applied both to the existing grids and the future "smart grids". The approach of the invention is based on a mathematical description of the connectivity aspects of the power grid. When projected onto a geographical map, the topological information provides the desirable account of the state of the network.

Each power distribution network is described by a Graph represented by Nodes of specified nature (such as generators, transformers, loads, switches, and storage units), their specified geographical position on a 2D map, and the topology of connecting lines. The state of the network is further characterized by the energy flow over the Graph. The energy flow is impractical to measure as it requires expensive sensors and sophisticated installation. According to the invention the state of the network can be adequately characterized by specifying the Root Mean Square (RMS) currents and the direction of energy flow in all connecting lines.

The instantaneous RMS currents are impractical to record, as they fluctuate on a short time scale; therefore averaging is required. It is essential that the averaging is carried out synchronously over the entire Graph over a specified time interval.

The purpose of the electrical grid monitor system (EGMS) of the invention is to create and continuously update both the Graph and the State of a power network. The system is based on a network of sensors, installed on every connecting line and communicating measured data to a central processing unit (CPU). The reported data empower the CPU to reconstruct the power distribution network.

The grid connectivity is embodied in Kirchhoff's current law that should be valid at every node of the network and should not be violated by averaging. Averaging is expected to be done locally at each sensor with global synchronization aided by the GPS. The minimum data from each sensor should include the direction of energy flow relative to the nearest node, the RMS current averaged over a chosen averaging period and the geographical position of the sensor.

DESCRIPTION OF THE INVENTION

A typical power distribution network comprises a multiplicity of Nodes (N) connected by Connecting Lines (CL). A connecting line comprises at least two or a multiplicity of conducting wires, referred to as phase wires. Each connecting line has two associated Nodes at opposite ends thereof. The connecting line phase wires are not equivalent, e.g., for a single phase connecting line one of its two wires is the hot wire, and the other is neutral or ground wire. These phase wires must be appropriately matched with the respective Node.

Nodes can be at least of various types including, Power Sources (PS), Loads (L), and Power Converters (PC), e.g. transformers and switches The type of node is reflected in the direction of energy flow. Each node has at least two or a plurality of ports associated with the connecting lines connected to it. A power source node is characterized by the outward direction of the energy flow in the associated connecting line. The load node is characterized by the inward direction of the energy flow in the associated connecting line. The power converter node typically has at least one inward and one outward connecting line. There can be also bi-directional nodes, such as rechargeable batteries.

Each power distribution network is fully described by a Graph represented by Nodes of specified nature and specified geographical position on a 2D map, and the topology of connecting lines. The state of the network is further characterized by the energy flow over the Graph. The energy flow depends on time. The instantaneous value of the energy flow is impractical to record, as it fluctuates substantially. It is essential to specify the time interval over which the energy flow is averaged. It is also essential that the averaging is carried out synchronously over the graph.

Figure 1A:
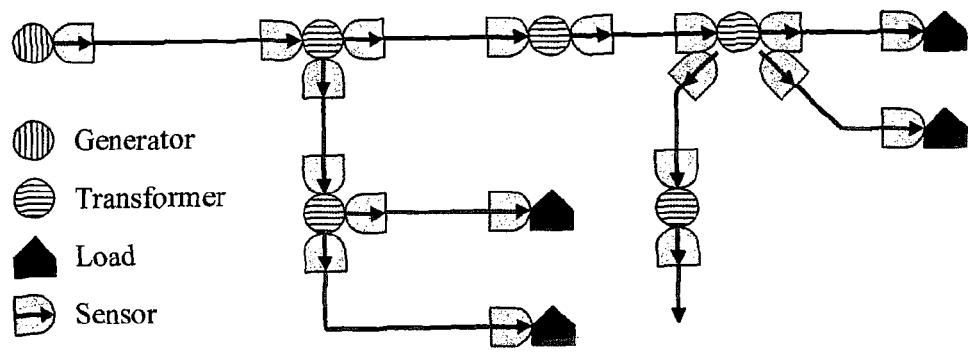
FIG. 1A is a diagram illustrating a power grid and a sensor mesh network.
Figure 1B:
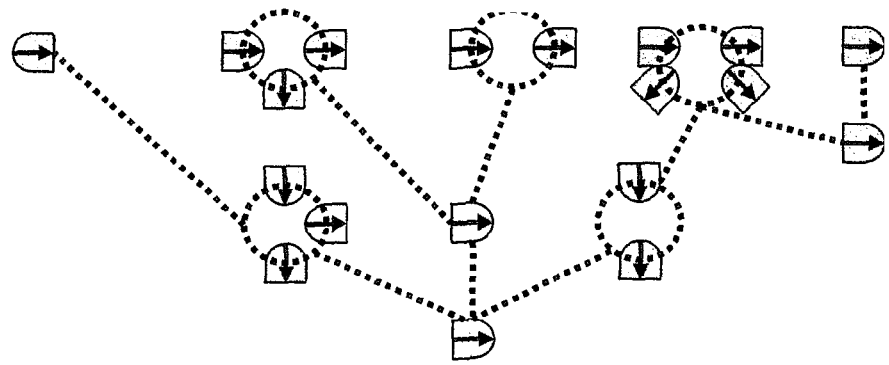
FIG. 1B is a diagram illustrating established communication links shown by dotted lines.
Figure 2:
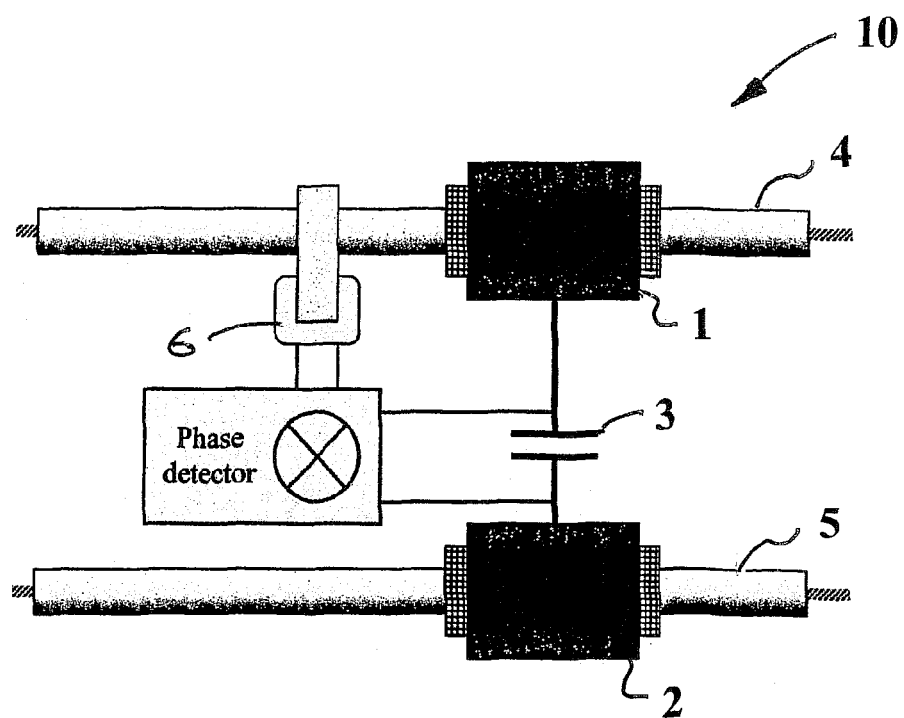
FIG. 2 is a diagram illustrating a non-galvanic measurement of the direction of energy flow in AC wire.

Various topologies of the communication network and the power grid itself are illustrated in FIGS. 1A and 1B. FIG. 1A shows power grid and sensor mesh network. FIG. 1B reflects established communication links which are shown by the dotted lines.

According to the present invention, a network of sensors is associated with the power network. One of the main functions of the sensors is to measure and report the physical quantities that enable a Central Processing Unit (CPU) to create and update both the Graph and the State of the Power network. The sensor network may be of different topology than the Graph of the power network itself, as illustrated in FIGS. 1A and 1B. Specification of the nature and properties of the required sensors, as well as their positioning within the Power network, constitute an essential aspect of the present invention. Topology of the sensor network is determined by the need for efficient communication between individual sensors and the CPU.

The Central Processing Unit is a computer that communicates with sensors via the sensor communication network and is capable of creating and updating the Graph and the State of the Power network. This occurs on the basis of data received from all individual sensors. This is an essential task of the central processing unit. Additional tasks may be also advantageously carried out by the central processing unit, e.g., prediction of the future state of the network.

The reported information about the distribution of the Root Mean Square (RMS) currents and the directions of energy flow enables the central processing unit to reconstruct the power network both as the graph and the state of the graph. To accomplish this, the CPU will begin from any high-level node, e.g. from the main generator, and reconstruct the graph by branching from node to node with the help of Kirchhoff's law. In this way a purely topological description is obtained. It is known how nodes are connected but not where they are positioned. Geographical placement of sensors is accomplished by using satellite based systems, such as for example Global Positioning System (GPS).

A predetermined sensor should measure several physical quantities, such as the value of Root Mean Square (RMS) current, synchronously with other sensors of the network. Measurement of other quantities, such as direction of the energy flow, does not require precise synchronization. The preferred way of synchronization is to use available satellite based systems, such as Global Positioning System (GPS) or Global Navigation Satellite System (GLONASS). Alternatively, one may use radio-broadcast time synchronization systems.

As to one aspect of the invention Kirchhoff's law is utilized as a tool for network topology reconstruction. Full description of a power grid in operation (State of the Graph) could be provided by the complete diagram of the energy flow. To build such a diagram one needs the knowledge of the Poynting vectors, $S=E \times H$, in every conducting line. However, a monitoring system based on the direct measurement of the Poynting vectors can be impractical and costly.

Precise determination of the electric field vector E requires measurement of the potential on the high-voltage wire relative to ground. One can avoid direct galvanic connection to AC wire by using cylindrical capacitive probes. However, to avoid uncontrollable phaseshift, the impedance of a voltmeter arranged between these probes would have to be much larger than their impedance, i.e. at least as high as 1 G$\Omega$—due to the unavoidably low capacitance of the probes. Such a voltmeter would be costly and impractical for the purposes of the invention Moreover, a description based entirely on the energy flow would not fully reflect the connectivity of the network. This is because the flow of electromagnetic energy over the network does not obey a continuity equation because of dissipation.

The continuity equation that works over the power network reflects the conservation of charge and is embodied in the Kirchhoff law (for current). This suggests Kirchhoff's law as an essential tool for topology reconstruction. Measurement of the current magnitude in a wire is simple and non-galvanic. In practice, it reduces to measuring the magnetic field at a distance from the wire. Consistent application of Kirchhoff's law needs an additional ingredient, such as the current direction. As to this ingredient, it should be noted that the AC current has no direction. When the current is characterized it by a Root Mean Square (RMS) value, "the arrow" can be pointed either way. The issue can be resolved by a simple convention to point the arrow in the direction of the energy flow. This information is encoded in the orientation of the Poynting vector.

Measurement of the orientation (and not magnitude) of the Poynting vector is a simpler task that can be accomplished without galvanic connections. All that is needed is the phase between AC current and AC voltage, without need for the knowledge of their magnitudes. Referring now to Fig., which illustrates non-galvanic measurement of the direction of energy flow in AC wire. The relative phases of voltage and current are determined accurately by the capacitive voltage divider 10 ($C_{p1}$-$C_m$-$C_{p2}$) and the current sensor 6, e.g. a current transformer. The capacitive divider 10 adds no phase-shift to the measurement. The capacitive divider 10 comprises two insulated cylindrical probes of capacitance 1 and 2 ($C_{p1}$) and ($C_{p2}$) associated with insulated wires 4 and 5 respectively, in series with a measuring capacitor 3($C_m$). The magnitude of the voltage drop on $C_m$ is rather uncertain because the capacitance of the cylindrical probes is poorly controlled but the phase of this voltage drop is monitored accurately. Knowledge of the Poynting vector orientation in each conducting line will ensure consistent application of Kirchhoff's law.

Figure 3:
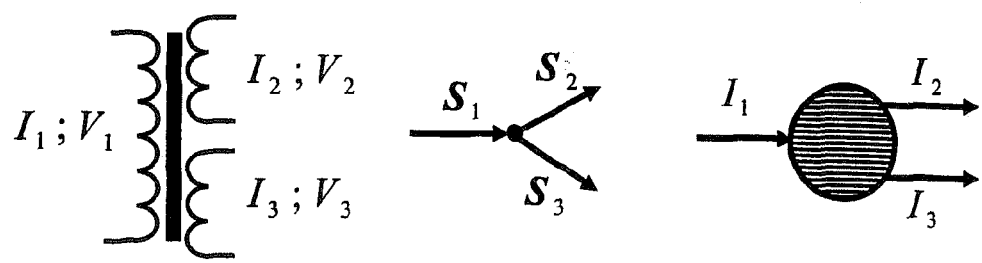
FIG. 3 is a diagram illustrating application of generalized Kirchhoff's law for a transformer node.

As to another aspect of the invention Kirchhoff's law is also utilized for transformer nodes. A power transformer comprises a plurality of primary and secondary coils carrying AC currents that interact magnetically. Each coil is an element of a circuit where Kirchhoff's law is in full obeisance. The law, however, fails to describe the relation between currents in different coils of the transformer itself, which is an extended object, not a simple point node. There are two reasons for this failure: the transformation coefficient $k_{ij} \equiv V_j/V_i \neq 1$ between the voltages on any pair of primary and secondary coils and the power loss $\eta < 1$ in the ferromagnetic core. Parameters $k_{ij}$ and $\eta$ are characteristics of any transformer, assumed known to the Central Processing Unit (CPU). Knowledge of these parameters enables us to extend Kirchhoff's law to the case of a transformer by a simple generalization, $$\eta I_1 = k_{12} I_2 + k_{13} I_3, \tag{1}$$

where $I_j$ denote the currents flowing in and out of the transformer node, cf. FIG. 3. With this generalization, Kirchhoff's law assumes a universal validity over the entire network. Each graph thus reduces to a set of homogeneous equations for $\{I_j\}$ that any legitimate state of the graph must obey.

Generalized Kirchhoff's law (1) for a transformer node (see FIG. 3) allows one to represent the latter as a point node. In this representation, currents $I_1$, $I_2$, and $I_3$ are the RMS values of the AC currents flowing in the hot wire of the transformer coils, related by Eq. (1). By convention, the ground wire is ignored and chosen is the orientation of the hot-wire current $I_j$ as that of the corresponding Poynting vector $S_j$.

The above approach enables one to fully describe the simplest state of the power network that corresponds to a stationary power distribution. If the state remained stationary, the RMS values could be measured asynchronously in different parts of the network.

The non-stationary situation is often more relevant. As loads vary, the RMS currents themselves become functions of time, $I_j = I_j(t)$. These functions can be averaged over any period $\tau$ shorter than the characteristic times $T_j$ of their variations without losing significant information, provided this averaging does not violate Kirchhoff's law. For a single node, this will be ensured if the averaging is done over the same time interval for all connecting lines associated with it. This will remain true for the entire network, provided the averaging is done synchronously over all nodes. In the process of averaging, "instantaneous" RMS currents $I_j(t)$ are replaced by the integrals, $$\bar{I}_j(t) = \int_t^{t+\tau} I_j(t')dt'. \tag{2}$$

The averaging period $\tau$ is a design choice that can be optimized depending on the network conditions. The choice is a trade-off between the resolution of individual disruptive events (optimized by the shorter $\tau$) and the economy in the information transmitted over communication channels. In any case, we expect $\tau$ to be much longer than the AC oscillation period of 16 mS.

Averaging periods are the time intervals selected synchronously over the graph for the purpose of averaging the energy flows. The averaging periods must be long compared to the characteristic time of the fluctuations in the energy flows associated with random load variations. The average energy flow in a particular connecting line is analogous to the coordinate of a Brownian particle continuously bombarded by molecules from all sides. It is that coordinate that we are interested to follow in time by averaging over many molecular impacts. The averaging period must therefore be short compared to the time of coordinate variation of the Brownian particle, i.e., of the variations in local energy flows.

The invention aims at making the system inexpensive and safe, and requires self-organization of each sensor. In the maintaining the system of the invention the installer needs not program the sensor as to where it is installed. Each sensor learns its x-y position from the GPS and uses this information for self-identification in the mesh network. The current GPS receivers provide an accuracy of order 1 m horizontally, which should be sufficient to distinguish sensors belonging to different nodes. Sensors belonging to the same node (on different connecting lines) will be identified as such. All sensors should be installed oriented in the same way relative to the nearest node, which will enable the identification of upstream or downstream power lines via measured orientation of the Poynting vector.

In addition to two-dimensional, x-y position, used for self-identification of sensors, the GPS provides three-dimensional, altitude information with respect to an additional z coordinate. This information can be used for fast identification of falling poles. This information is obtained free of additional charge and will become more and more useful with increasing accuracy of the GPS.

The minimum data required to be collected by the sensors and reported to the central processing unit is determined by the requirement that the CPU is capable of reconstructing from these data both the Graph and the State of the network. At the minimum the reported data include the geographical position of each sensor, the direction of the energy flow and the value of Root Mean Square (RMS) current through each sensor, synchronously measured over the entire network and averaged over chosen averaging period. In a preferred embodiment the reported data may be restricted only to changes in the measured parameters rather than parameters themselves. This may be used whenever communication bandwidth is limited. Depending on the type of the sensor used, the required information may include the sensor orientation relative to the gravitational and magnetic fields at the sensor location. Furthermore, the additional collected data may include the temperature and humidity at the sensor location, as well as other environmental information.

For the purposes of the invention, the global positioning system (GPS) provides two cornerstone signals indispensible for the functioning of the EGMS, one pinpointing space, the other time which synchronizes the averaging process over the entire grid. Synchronization delegates the task of averaging, i.e. performing the integration (Eq. 2), to individual sensors, thus significantly lowering the communication budget.

The required accuracy of synchronization is not taxing at all. The required is mainly specification of the initial moment with a resolution better than half-period of AC oscillation (8 mS). This task would not be easy to accomplish through the sensor network itself because of the unpredictable delays associated with its contemplated mesh nature. The GPS provides a synchronizing signal theoretically accurate to about 10 nanoseconds. However, most receivers lose accuracy in the interpretation of the signals and are only accurate to 100 nanoseconds. Either way (by 6 or 5 orders of magnitude), this precision far exceeds the required accuracy.

A convenient way of averaging the RMS signal is to integrate over exact number of periods, $N=2\pi f\tau$ with integer N. This reduces the integration error and suppresses the noise associated with asynchronous interference. An appropriate circuit for this task involves a zero crossing detector, a programmable counter and an integrator.

In order to reduce the amount of information to be communicated to the central processing unit, each sensor carries out local data processing and storage. One of the essential data processing functions is averaging the Root Main Square (RMS) current over the averaging period selected for the entire network. In some cases, the local values of RMS voltage are known. In this case the processing functions may include evaluation of the energy flow through the sensor, based on the calculated average values of RMS current, and the directions of the energy flow.

The sensors of the invention are able to operate in two modes, normal and emergency. The emergency mode is distinguished by the absence of power in the connecting line. In the normal operation mode, the sensors are powered by power network itself, preferably through a current transformer. In the emergency operating mode, this power is not available and the sensor must draw energy for its operation from an alternative power source. In the preferred embodiment, the alternative power source is a rechargeable battery or super-capacitor that is charged during the normal operation. Other alternative power sources may include many conventional power sources including but not limited to solar batteries or windmill generators. The amount of power required in the emergency mode should be minimized by curtailing many of the normal operating functions. At the minimum, in the emergency operating mode, the sensor acts as a beacon reporting the absence of power in the connecting line.

The communication functionality is essentially different in the two operating modes. In the normal mode, the preferred mode of communication is bi-directional. In this mode, each sensor can perform both send and receive functions. In this case, the preferred communication network is of mesh type, wherein sensors communicate with the central processing unit via mediation of neighboring sensors or via intermediate communication units as in cellular telephony. In the emergency mode, the sensor abandons its receive function and sends rare and short messages that identify its position. These messages, when received by the nearest normally powered and fully functional sensor, are related to the CPU by the residual mesh network still in place. This information enables the CPU to establish both topological and geographical boundaries of the failure region.

Topologically, the sensor of the invention includes two Ports. A connecting line is associated with one of these Ports leading to the nearest Node. The other connecting line is associated with a remote Node. In the preferred embodiment, the sensor internal structure is symmetric with respect to both ports. For the purpose of sensor orientation, the port leading to the nearest Node can be identified, e.g. by color. This orientation is an essential characteristic of the sensor. This is because the sensor measures the direction of the energy flow or the instantaneous direction of current with respect to the above-mentioned orientation. Furthermore, the phase wires of the connecting line Ports should be matched with respect to those of the Node. This enables the sensor to identify the instantaneous voltage polarity. The color marking will enable the installer to orient the sensor in a recognizable way.

In order to assure the safety of users, the individual sensors should not have galvanic contacts with any of the phase wires of the connecting line.

Figure 4:
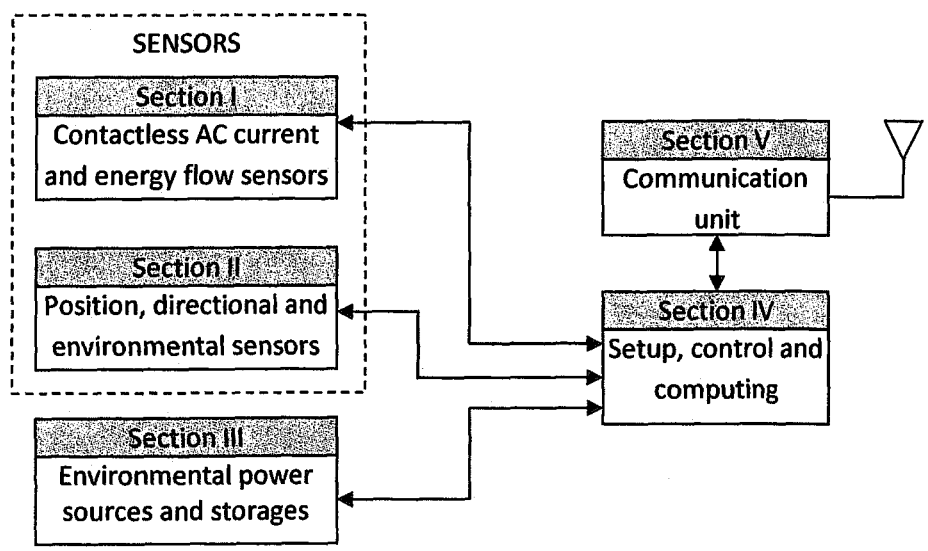
FIG. 4 illustrates a general structure of the sensor of the invention

We are referring now to FIG. 4 showing the internal implementation of the primary sensor of the invention. It is illustrated in this figure that, the first section (Section I) is the main contactless element sensitive to AC current magnitude. The current sensor can be implemented as a current transformer, a "Rogowski coil", a Hall effect sensor, or some other magneto-sensitive (e.g. magneto-resistive or magneto-optical) element. The essential function of this sensor is to measure the magnitude of AC current in the primary wire without direct electrical coupling. Section I also comprises directional detector of energy flow. This detector is preferably based on the measurement of the direction of the Poynting vector associated with the energy flow in the connecting line.

Section II comprises sensors of position and spatial orientation of the sensor body. It may also include environmental sensors, gauging such variables as temperature, sunlight and humidity. Altogether, there may be three different kinds of sensors in Section II.

Position sensor (GPS, GLONASS or similar one) provides the geographical position of the sensor. Such position can be used to generate a unique network address of the sensor and serves the needs for automatic sensor map generation.

Directional sensor (e.g. electronic compass or radio compass) is activated after installation and upon measuring the spatial orientation of the sensor body in the ground plane relative to a standard local axis.

Environmental sensors are collecting information about important parameters affecting the power consumption activity, relative to the intensity of sunlight, the temperature and the humidity. Furthermore, additional environmental sensors may be deployed identifying the wind speed and direction, the atmospheric pressure, etc.

Section III comprises environmental power sources and energy storage elements. This section is responsible for power collecting and storage. Many conventional environmental sources of energy can be implemented separately or in combination. Among these sources of energy are: solar cell, windmill generator, current transformer, etc.

Current transformer is preferably combined with the current sensor of Section I by using two secondary coils on the same magnetic core.

In one of the embodiments, the energy storage function is implemented as a combination of rechargeable batteries with super capacitors. To ensure the best utilization efficiency of environmental energy the power distribution from different sources to storage devices is controlled by a storage algorithm. Initially, this algorithm automatically directs the electrical charge energy into the super capacitor. Only after the capacitor is fully charged, the energy is re-directed into the rechargeable battery.

Section IV is the computing unit. It is the main control unit of the sensor. Installation and control parameters are stored in this unit as well. The unit controls activation of all sensors in a programmable manner. It also keeps the setup information and includes the geographical position, the orientation and the status of the sensor. Software of the control unit consists of system and operational parts.

The System part contains non-erasable data and provides the main communication and power control functions. It also controls data exchange with the communication network.

The Operational part (loadable) controls the sensors, the data storage and the processing operations. This part can be updated from time to time over the wireless network.

A control unit is provided to run both in the power-saving mode and the full-power mode. Such modes are selected by the internal power meter (decision based on level of storage and generated energy). Another preferred way to control the consumed energy is through the use of a multi-core processor with selectively activated memory blocks.

An important function of the main control unit is the power failure detection. When the consumed power is below a pre-selected threshold, the sensor switches into the "power failure beacon" mode. In this mode, the sensor minimizes all internal loads and sends an alarm message, which includes the sensor identification.

Section V is the main communication unit, formed with a protection (encryption) arrangement and it provides two modes of communications. The first mode is short distance/high speed adapted for service personnel; whereas the second mode is long distance/low data rate provided for main operation.

The short distance mode supports one of the popular communication standards (Bluetooth, Zigbee, Wi-Fi, etc.). In this mode, the service personnel is provided with fast data reading and fast software updates.

The long distance mode must be prepared for emergency operation. In particular, it must ensure that the point of power failure will be rapidly located. In the "power failure beacon" mode, each sensor only relays data so long as it has access to power. This means that the CPU will be able to identify essentially only those points of power failure that are near the still normally functioning parts of the sensor mesh network. In the case of a massive failure, this information is sufficient for the CPU to establish the topological and geographical boundaries of the disaster region.

With respect to operation, the central processing unit (CPU) interrogates all sensors on the network, receives the data from each sensor, constructs the Graph and evaluates the state of the network. In the preferred embodiment the communication unit of the CPU is located near one of the power source nodes, also referred as the central node. The Graph is then constructed sequentially, starting from the central node and branching out in the direction of remote loads, maintaining the averaged Kirchhoff law for the RMS current at each node and taking into account the geographical position of the nodes. Position of each node in the Graph is determined by the geographical position of the associated sensors.

The monitoring system of the invention provides the technical capability for apprehension of unwelcome leaks of the power, associated, for example, with unlawful tapping of the grid by an unrecognized party. Any tampering with the network which results in unaccounted current flow will generate a violation of the above discussed set of equations, and should be seen by the CPU with a pinpointed location. In a fully implemented version of the grid monitoring system, with sensors installed at all lines down to every user, the presence of an illegally tapped line will be seen automatically, since said illegally tapped line will have no associated sensor. The leaked power will therefore not be reported by the sensor network and the state of the power network will exhibit a violation of Kirchhoff's law. This will provide a nearly instantaneous automatic detection of the unlawful leak.

In the case of an incomplete network, tampering with the power distribution at a level below the monitored level can be uncovered by comparing the total energy incoming into the last monitored node over a specified period with the sum of energies received by all legitimate customers from that node. A significant discrepancy will trigger investigation. This discovery, however, would not be instant nor automatic and this consideration may be a compelling incentive for the power grid owner to complete the sensor network down to every customer.

What is claimed is:

1. A network of sensors associated with a power distribution network, said network of sensors comprising:
    said sensors positioned at each end of each connecting line at each node of said power distribution network, said sensors positioned in a non-contact manner with respect to each line; and
    a central processing unit (CPU) adapted to receive information from said sensors;
    wherein each of said sensors regularly reports measured data from each line to said central processing unit, said measured data comprising:
    a geographical position of the reporting sensor;
    a direction of energy flow relative to a node nearest said reporting sensor, and
    a value of Root Mean Square (RMS) current for the reporting sensor averaged over a chosen averaging period, said RMS current measured synchronously at all said sensors in the network; and
    wherein said central processing unit includes an arrangement for receiving said measured data and applying said data for constructing and updating a graph of the state of said power distribution network.

2. The network of sensors of claim 1, wherein the synchronous measurements are carried out by means of a group of satellite based systems selected from the group including: Global Positioning System (GPS) and Global Navigation Satellite System (GLONASS).

3. The network of sensors of claim 1, wherein the measured data includes changes in measured physical quantities relative to previously reported quantities.

4. The network of sensors of claim 1, wherein processing functions further include evaluation of the energy flow through the sensor based on the known Root Mean Square voltage and the calculated average values of Root Mean Square current.

5. The network of sensors of claim 1, wherein each sensor is formed with two ports, a first of said two ports connecting the sensor to said node nearest said sensor and a second of said two ports connecting said sensor to a remote node.

6. The network of sensors of claim 1, further comprising an AC current magnitude sensor, said current magnitude sensor selected from the group comprising:

a current transformer, a "Rogowski coil", a Hall effect sensor, or other magneto-sensitive, magneto-resistive and magneto-optical elements.

7. The network of sensors of claim 6, further comprising a directional detector of energy flow, said directional detector is adapted for measurement of the direction of the Poynting vector associated with an energy flow in a connecting line.

8. The network of sensors of claim 1, further comprising at least one positional sensor for determining a position and a spatial orientation of a sensor body of at least one of said sensors, said positional sensor including an environmental sensor.

9. The network of sensors of claim 1, each of said sensors further comprising a position sensor providing a geographical position of the sensor; a directional sensor providing a spatial orientation of the sensor body; and an environmental sensor for collecting environmental data effecting power consumption of the sensor.

10. The network of sensors of claim 1, further comprising an environmental power source and energy storage elements adapted for power collecting and storage.

11. The network of sensors of claim 10, wherein the energy storage elements include a combination of rechargeable batteries and super capacitors.

12. The network of sensors of claim 1, further comprising a computing unit for controlling the sensors, so as to activate all sensors in the network in a programmable manner.

13. The network of sensors of claim 1, further comprising a system part for providing communication and power control functions, and an operational part for controlling the sensors, the data storage and processing operations.

14. The network of sensors of claim 1, further comprising a control unit for handling a power-saving mode and a full-power mode.

15. The network of sensors of claim 14, wherein consumed energy is controlled by means of a multi-core processor with selectively activated memory blocks.

16. The network of sensors of claim 14, wherein said control unit is adapted for power failure detection, so that upon consumed power reaching below a pre-selected threshold, the sensor switches to a "power failure beacon mode", in which internal loads of the sensors are minimized and an alarm message is generated.

17. The network of sensors of claim 1, further comprising a main communication unit for providing a short distance, high speed mode adapted for personnel service and a long distance, low data rate mode adapted for main operation.

18. The network of sensors of claim 1, wherein said CPU is adapted to run computational algorithms enabling construction of a topological model of the power network based on consistent application of Kirchhoff's law.

19. The network of sensors of claim 18, said CPU further comprising a computation arrangement for detecting tampering with the power distribution network based on a detected violation of Kirchhoff's law, the violation caused by an unauthorized leak.

20. The network of sensors of claim 18, wherein said CPU is adapted to detect tampering with the power distribution network at a level below a monitored level by comparing total energy incoming into a last monitored node over a specified period of time to the sum of energies received by all legitimate customers from that node.

* * * * *